(12) United States Patent
von Gutfeld et al.

(10) Patent No.: US 6,348,846 B1
(45) Date of Patent: Feb. 19, 2002

(54) FILTER CIRCUIT INCLUDING SYSTEM FOR TUNING RESONANT STRUCTURES TO CHANGE RESONANT FREQUENCIES THEREOF

(75) Inventors: Robert Jacob von Gutfeld, New York; James F. Ziegler, Yorktown, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/417,894

(22) Filed: Oct. 14, 1999

(51) Int. Cl.$^7$ .......................... H03H 9/22; H01L 41/12
(52) U.S. Cl. ............... 333/201; 333/186; 333/219.2; 333/235; 310/26; 334/4; 331/157
(58) Field of Search .................. 333/201, 202, 333/186, 219, 219.2, 235; 310/26; 334/4; 340/572.6; 331/157

(56) References Cited

U.S. PATENT DOCUMENTS

| | | | |
|---|---|---|---|
| 3,626,334 A | 12/1971 | Keyes | 333/152 |
| 4,295,173 A | 10/1981 | Romankiw et al. | 360/125 |
| 5,495,230 A * | 2/1996 | Lian | 340/551 |
| 5,529,745 A * | 6/1996 | Mori et al. | 419/38 |
| 5,552,778 A * | 9/1996 | Schrott et al. | 340/825.34 |
| 5,998,995 A * | 12/1999 | Osiander et al. | 324/259 |
| 6,137,412 A * | 10/2000 | Herzer | 340/572.6 |

OTHER PUBLICATIONS

Nguyen, et al., "Micromachined Devices for Wireless Communications", Proceedings of the IEEE, vol. 86, No. 8, Aug. 1998, pp. 1756–1768.
Robert W. Keyes, "Device Implications of the Electronic Effect in the Elastic Constants of Silicon", IEEE Transactions on Sonics and Ultrasonics, vol. SU–29, No. 2, Mar. 1982, pp. 99–103.
Cleland, et al., "Fabrication of high frequency nanometer scale mechanical resonators from bulk Si crystals", Appl. Phys, Lett. 69, vol. 18, Oct. 28, 1996, pp. 2653–2655.

* cited by examiner

Primary Examiner—Robert Pascal
Assistant Examiner—Barbara Summons
(74) Attorney, Agent, or Firm—McGinn & Gibb, PLLC

(57) ABSTRACT

A structure (and method) for tuning a resonant structure, includes a resonant structure including either a predetermined material coating provided on either a bar or a cantilever, or a lightly doped single crystal semiconductor material, and a circuit for providing a variable field adjacent the resonant structure, with the length or at least one of the elastic constants of the resonant structure changing with the application of the variable magnetic or electric field, respectively, thereby to selectively tune the resonant structure.

32 Claims, 2 Drawing Sheets

FILTER CIRCUIT INCLUDING SYSTEM FOR TUNING RESONANT STRUCTURES TO CHANGE RESONANT FREQUENCIES THEREOF

BACKGROUND OF THE INVENTION

1. Field of the Invention

The present invention generally relates to a method and system for tuning micro-electro mechanical (MEMS) cantilevers or bars to change their resonant frequency, and more particularly to a method and system for tuning cantilevers or bars which are part of a filter mechanism used in telephony and the like.

2. Description of the Related Art

In a variety of electrical applications, such as telephony for example, certain incoming frequencies must be filtered, allowing only certain pre-set or desired frequencies to pass into the main circuit. To accomplish this selective passage, a tuned filter circuit is typically used.

In telephony (and other applications), extremely small filter circuits are used, some made by micro-electro mechanical means and devices. The filters contain mechanically resonant elements that vibrate when excited by their respective resonance frequency. When the applied frequency is off-resonance, there will be very little, if any, enhancement of the signal. Numerous papers and experiments describe the use of small cantilevers including the use of piezo-electric elements that have a distinct resonant frequency with a very high "Q" (e.g., quality factor). Hence, such circuits function as very good filters due to the selectivity imposed by their geometry.

However, a problem arises in that, hitherto the present invention, there have been no known methods for tuning the frequency of the mechanical resonators. While means for trimming the resonators exist, these trimming means and methods do not allow the circuit to be tuned over time due to temperature or other environmental conditions.

Other problems of the conventional systems and methods include that the trimming is a one-time event and cannot be undertaken once the device leaves the production facility.

SUMMARY OF THE INVENTION

In view of the foregoing problems, drawbacks, and disadvantages of the conventional systems and methods, an object of the present invention is to provide a structure and method for tuning the frequency of mechanical resonators.

Another object of the present invention is to provide a method and system for tuning the resonator circuitry over time to compensate for temperature and other environmental conditions, slight mechanical jarring, changes in atmospheric pressure, and the like.

In a first aspect of the invention, a system (and method) is provided for tuning a resonant structure, which includes a predetermined material coating provided on the resonant structure; and a circuit for providing a variable magnetic field (e.g., preferably a variable dc magnetic field) adjacent the resonant structure, with the length of the resonant structure changing with the application of the variable field, thereby to selectively tune the resonant structure.

With the unique and unobvious features of the present invention, a method and system are provided for tuning the frequency of mechanical resonators, including when the mechanical resonators or a circuit incorporating the mechanical resonators, undergo temperature or other environmental changes.

Further, without tunability as provided by the invention, the filter circuit becomes useless should there be any small mechanical or environmental changes such as those listed above.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1A:
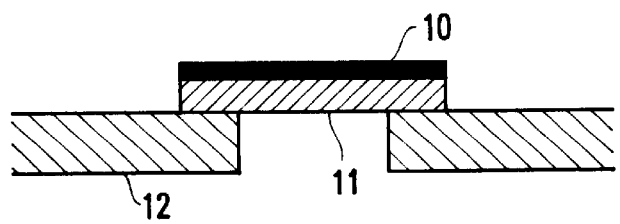
FIGS. 1A–1F are schematic diagrams of a resonant bar that is coated with a thin film of magnetostrictive material, and in which a magnetic bias field is shown with a separate control to vary its intensity to control the degree of magnetostriction.

Referring now to the drawings, and more particularly to FIG. 1, a method and system for tuning micro-electro mechanical (MEMS) or other small cantilevers or bars which are part of a filter mechanism used in telephony and the like, will be described. Obviously, the invention is not limited to any single application such as telephony, but can be advantageously employed in a variety of different devices and technologies such as atomic force microscopes or other applications requiring tuned filter circuits or applications where the precise resonance frequency is important over time.

Generally, in one non-limiting embodiment of the invention of the present invention, a specially formed cantilever or bar is provided. Cantilevers or bars can be useful in acting as a filter for incoming radiation, in particular, radio frequency (RF) waves extending into the microwave range. The cantilevers or bars preferably are coated with a thin layer on one or both broad sides (e.g., planes containing the major axis) with a magnetostrictive material. In the telephony application, the microcantilevers could be on the order of several microns in length, with a one-half micron thickness and a one-half micron width (e.g., typical dimensions). Obviously, the size of the cantilever/bar is not limited other than by design requirements and constraints. That is, the invention can be easily scaled for use and application.

A relatively small source (e.g., 10–100 oersteds) of magnetic field is provided in the vicinity of the cantilever (the elastic constant of the cantilever or bar changing only to second order with the application of the magnetic field). A length change is experienced by the bar due to the magnetostrictive material's change in dimension with the applied magnetic field. There are a class of materials called "terphenols" which have a much larger magnetostrictive constant, but would require dc fields on the order of 100–1000 oersteds to be effective.

Since the cantilever or bar serves as one plate of the capacitance of the RLC circuit, the mechanical resonance of the cantilever or bar can act to vary the capacitance of an RLC circuit by way of its vibration. At a resonance frequency of the cantilever, the capacitive value, C, of the circuit will be maximized. This value of C is chosen to correspond in the resonance of the RLC filter circuit.

Thus, if an externally applied RF field does not produce resonant mechanical excitation of the bar, the resulting capacitance and hence the RLC circuit will be off-resonance and will not readily pass through the filter. However, if the excitation produces a mechanical resonance, the bar will resonate and the capacitance of the electrical RLC circuit will be modulated at its resonant frequency. The selection of the proper DC magnetic field is used to change the length of the bar by way of magnetostriction in order that it resonate for a fixed RF input signal.

The strength of the applied field will determine the amount of compression or tension in the bar to alter its length, thereby changing its resonant frequency, making it tunable over a small range (e.g., tens of kHz) of continuous frequencies depending on the thickness of both the bar and thickness and type of the magnetostrictive material.

Figure 1B:
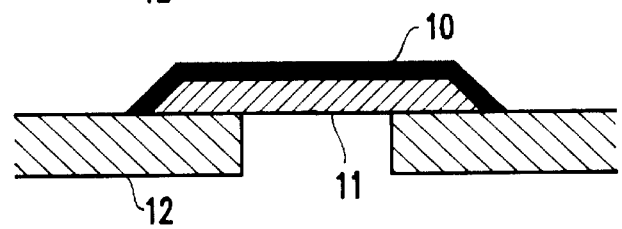
Figure 1C:
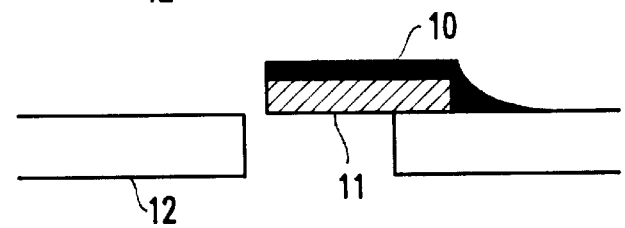
Figure 1D:
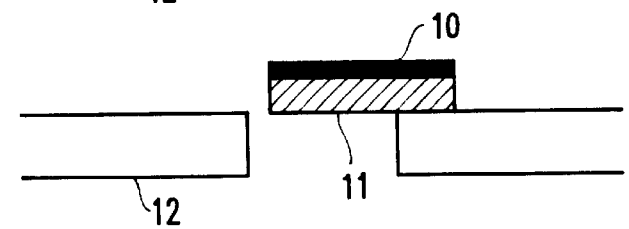
Figure 1E:
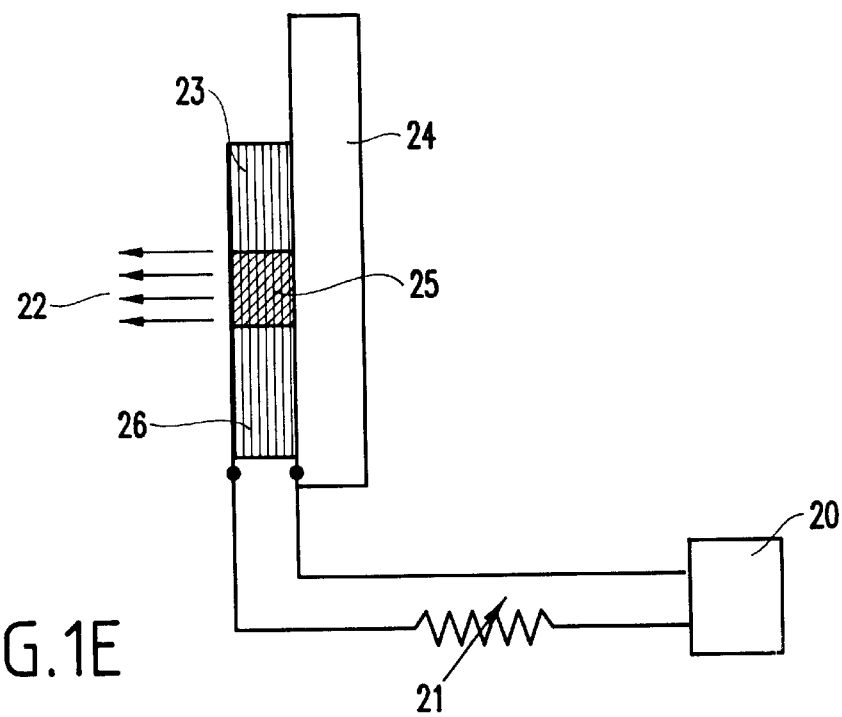

The magnetic field can be supplied by a small evaporated coil similar to ones used in magnetic heads (e.g., as shown in FIG. 1e and described below).

Additional ways of changing frequency of the bar is to change the elastic constants of the bar by doping a semiconductor (e.g., described below with regard to FIG. 2), so that the elastic constants are affected by an imposed dc electric field. This method has been shown to occur in a semiconductor having a many valleyed band structure.

First Embodiment

Turning now to FIGS. 1A–1F, a first embodiment will be described of the present invention. The present invention provides novel ways of tuning a resonant bar or cantilever 11, particularly those that are short along their major axis. This kind of bar or cantilever 11 resonator is particularly useful for telephony applications, but hitherto the invention, telephony applications utilizing these bar structures were too difficult to tune.

Thus, with the invention, for a fixed bar length, geometrical shape and thickness, there are well known sets of discrete and resonant frequencies that are proportional to the square root of the material's Young's modulus, E divided by the square root of the density times the reciprocal of the bar's length squared (e.g., see P. M. Morse, *Vibration and Sound*, Chapter IV, p. 151, McGraw-Hill, NY 1948).

To obtain tuning, a coating of a magnetostrictive film 10 is deposited (e.g., plated, vapor-deposited, ion bombarded, etc.) onto the resonant cantilever or bar 11. The cantilever thickness in certain telephony applications may be on the order of 0.5 μm, and the coating thickness may be about 100 Å to about 400 Å. The magnetostrictive material may be deposited on one or a plurality of sides of the cantilever. Preferably, both sides of the long axis plane are coated on the entire length and width thereof with the magnetostriction materials. For longer cantilevers or bars, magnetostrictive Metglas™ (Allied Signal, Inc.) can be glued to the structure though not practical for the small MEMS structures.

For example, the magnetostrictive materials for coating the bar may be at least one material selected from iron, cobalt, nickel and permalloy, the latter an alloy of nickel-iron that can be produced in varying proportions. As mentioned above, all of these materials can be plated, sputtered, ion bombarded, or vapor deposited, some as single crystals. The deposition can be on one or preferably on both sides containing the long axis of the resonant MEMS structure.

The coating/film 10 can span the length or even go beyond the length of the structure 11. The latter case is stronger or more robust and will likely be more effective in changing the bar's length with the application of a dc field.

The cantilever (bar) 11 is positioned on a support 12, here part of the MEMs structure. The cantilever (bar) 11 may be supported at one or both ends, although in certain telephony applications clamping at both ends is preferable as it provides stronger anchoring.

FIGS. 1B–1D illustrate other modifications of the resonant bar coated with a thin film of magnetostrictive material.

For example, FIG. 1B illustrates a structure in which the coating goes beyond the length of the structure, whereas FIG. 1C illustrates the structure being supported on only one end, but with the coating 10 going beyond the length of the cantilever 11 onto the support. FIG. 1D illustrates a structure in which the coating spans only the length of the bar (cantilever), and in which the bar is supported by only one end making it a cantilever.

Referring to FIG. 1E, a bias field is shown with a separate control to vary its intensity to control the degree of magnetostriction of the cantilever/bar 10.

In FIG. 1E, a coil is provided for magnetizing the magnetostrictive material 11.

Figure 1F:
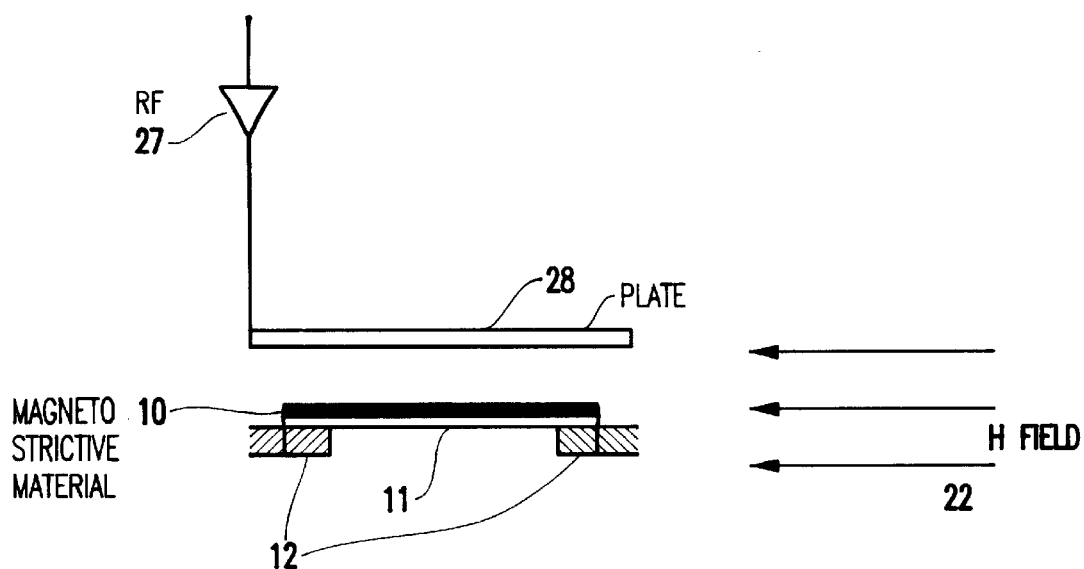

That is, in FIG. 1E, a magnetic field 22 is generated from a small set of coils 23 (e.g., several turns of wire, several mm. in diameter) connected to a variable direct current (DC) power supply 20. Alternatively, a highly permeable magnetic material (e.g., such as iron) is surrounded by wire windings 26 to produce a much higher field or flux than the wire windings alone. The current of coil 26 can be varied (e.g., by the potentiometer 21), and is used to control the degree of magnetostriction that occurs. FIG. 1F shows the structure of FIG. 1A in conjunction with an RF input 27 (and a conductive plate 28) and a magnetic bias field 22.

Because magnetostrictive materials expand or contract, depending on whether the magnetostriction is positive or negative, the resonant structure (e.,g. magnetostriction material 10/cantilever 11) will to a degree follow the change in dimensions. The major effect on the bar will be in a change in its length, L and hence its resonant frequency.

The resonant frequency, $f$ of a cantilever or bar is given by the equation, $$f=(K/L^2)$$

where K contains the square root of the Young's modulus divided by the density and other geometrical factors. For small dilations or contractions such as those utilized by way of magnetostriction, the change in frequency, $\delta f$ is related to the change in length $\delta L$ by a relationship obtained by taking the first derivative of the expression for $f$ with respect to L, $$\delta f = -2K\delta L/L^{-3}.$$

From the expression for magnetostriction, $$\delta L = \lambda(H)L$$

where $\delta L$ is the change in length of a bar of length L due to the application of a magnetic field, $\lambda(H)$ is the magnetostriction as a function of field, H and $\lambda(H)$ has a maximum value on the order of $\sim 30 \times 10^{-6}$ for numerous ferrous materials. For certain materials, $\lambda$ can have values as high as $\sim 2 \times 10^{-3}$, namely materials containing dysprosium and other rare earth elements, and are known as "terphenols".

These materials can also be plated, vapor-deposited, or ion-deposited. In the present invention, vapor deposition is a preferred method of depositing the terphenol material onto the cantilever or bar when very large magnetostriction is desired.

From the above equations, one obtains for the value of change in frequency δf, divided by frequency f, δf/f, the expression:

$$\delta f/f = -2\ \lambda(H)$$

As an example, for a typical terphenol, the change in frequency δf can be as high as 2 MHz for a bar resonating at 0.5 GHz since the value of $\lambda \approx 2 \times 10^{-3}$. This value of λ is obtained at the saturation field, H, typically a field on the order of ~1 kOe. Such field values can be readily obtained using a small coil of wire containing a ferrous core.

In a more specific example, a length is assigned to the cantilever and it is assumed that the cantilever is subjected to stress using a more conventional magnetostrictive material such as iron, cobalt, nickel and permalloy.

Transverse magnetostriction can also be obtained in certain magnetostrictively deposited materials. In that case, the change in dimension is substantially at right angles to the application of the magnetic field. Thus, there can be longitudinal changes along the major-axis of the cantilever for fields in a direction at right angles to the cantilever. The fractional change in length for application of modest magnetic fields (e.g., a few hundred oersteds or less) will be on the order of $20-40 \times 10^{-6}$.

Now, assume a bar length, L, to be $2 \times 10^{-4}$ cm in length having a resonance of ~1 GHZ prior to the application of the magnetic field. Upon application of the field, the bar becomes elongated (or compressed) due to magnetostriction. The maximum change in frequency, $\delta f/f = 2\ \lambda = 4-8 \times 10^{-5}$, which gives rise to a tuning range of ~40–80 kHz. Since the magnetostriction is symmetrical with field direction, tuning to greater or lesser frequencies can best be obtained by maintaining the structure at a modest intermediate field, that is one well below the saturation field, the field that gives the maximum value of λ, and a zero field. Then, an increase or decrease in field results in an increase or decrease in magnetostriction and correspondingly changes in frequency of the bar.

Second Embodiment

Figure 2:
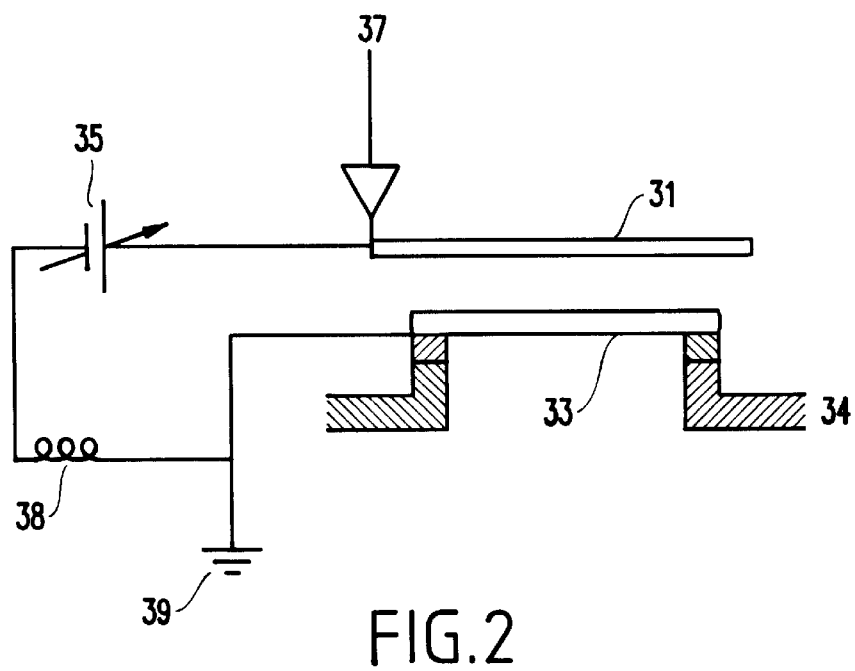
FIG. 2 is a schematic diagram of a lightly doped single crystal silicon bar in the vicinity of a plate, thereby forming a capacitive structure to which a voltage is applied, and in which the degree of electric field supplied between the plate and bar due to the applied voltage determines the degree to which the elastic constants of the vibrating element can be changed, thereby causing variations in the resonant frequency.

Referring to FIG. 2, a second embodiment of the invention will be described. The second embodiment of the invention uses the "Keyes effect", and is different from the first embodiment. It uses a single crystal semiconductor bar placed in an applied electric field, as opposed to the magnetic field of the first embodiment.

With this embodiment, it also becomes possible to tune the resonance of a bar or cantilever, here by causing changes in the elastic constants of a thin bar on the order of 1000 Å or so. The Young's modulus E is proportional to the elastic constants so that the resonant frequency of the bar becomes dependent on the change in the elastic constants.

By applying a voltage to the electrode above and in close proximity to the cantilever, as shown in FIG. 2, the elastic constants change of a layer within the bar decreases in accordance with an effect known as the Keyes effect. To obtain this effect or change in elastic constants requires the use of single crystals (silicon, Ge, etc.) slightly p- or n-doped to values on the order of $1 \times 10^{15} - 10^{16}$ dopant atoms per cm$^3$ to make the bar conducting. Under the action of the electric field, an accumulation layer is developed near the bar (or cantilever) surface closest to the plate which may extend several hundred Angstroms into the bar from the surface.

The accumulation of charge results in a change in the bar's elastic constants, hence in Young's modulus and the bar's resonant frequency. Thus, tuning is achieved by varying the voltage (and hence the electric field) between the plate 31 and bar 33 of FIG. 2.

The resonant bar is shown, consisting typically of single crystal silicon or germanium doped to a level of $1 \times 10^{15}$ to $1 \times 10^{16}$ either p-type (e.g. B, Al, Ga) or n-type (e.g. P, As or Sb) to make it electrically conducting. The resonant structure is held in position by a support structure 34 and the bar preferably clamped at each end. Also shown is an inductor 38 in series with a variable dc voltage supply 35 to provide the electric field between the plate 31 and bar 33. The inductor prevents RF input 37 (or high frequency, typically in the MHz range or higher) to plate 31 from shorting to ground 39. The RF input causes the bar to be set into resonance when its resonance frequency has been appropriately set by tuning using the electric field provided by the variable voltage supply 35. It should be noted that the RF is only one of many ways that the tuned bar can be set into motion as is well known to those skilled in the art while the tuning method of the present invention is quite generic.

The resonant structure is held on bar support 34, and preferably is doubly clamped thereby (e.g., supported at first and second ends of the resonant structure).

In the embodiment of FIG. 2, the degree of electric field supplied by the capacitive structure formed by the plate 31 and bar 33 determines the degree to which the elastic constants of the vibrating element can be changed, thereby causing variations in the resonant frequency.

As mentioned above, the advantages of the second embodiment are the same as the first embodiment but are not as effective for bar structures much thicker than ~0.5 μm.

The first embodiment, while described for MEMs applications can also be used for tuning cantilevers of much larger dimensions. In principle, there is no restriction on the dimensions except that the effective compression or dilation becomes smaller for thicker cantilevers unless the magnetostrictive layers become so thick as to be impractical.

While the invention has been described in terms of preferred embodiments, those skilled in the art will recognize that the invention can be practiced with modification within the spirit and scope of the appended claims.

What is claimed is:

1. A system for tuning a resonant structure, comprising:
   a predetermined material coating provided on said resonant structure;
   an electrically conductive plate formed adjacent said resonant structure, said plate and said resonant structure forming a variable capacitor; and
   a circuit for providing a variable magnetic field adjacent to the resonant structure, with the length of the resonant structure changing with the application of the variable field, thereby to selectively tune the resonant structure.

2. The system according to claim 1, wherein said predetermined material coating comprises a magnetostrictive material coated on at least one side of said resonant structure.

3. The system according to claim 1, further comprising:
   an antenna operatively coupled to said plate.

4. A system for tuning a resonant structure, comprising:
   a magnetostrictive material provided on said resonant structure; and
   a circuit for providing a variable direct current (DC) field adjacent the resonant structure, with a length of the resonant structure changing with the application of the variable field, thereby to selectively tune the resonant structure, wherein said resonant structure functions as an electronic filter for incoming radiation.

5. A system for tuning a resonant structure, comprising:
a magnetostrictive material provided on said resonant structure;
an electrically conductive plate formed adjacent said resonant structure, said plate and said resonant structure forming a variable capacitor; and
a circuit for providing a variable direct current (DC) field adjacent the resonant structure, with a length of the resonant structure changing with the application of the variable field, thereby to selectively tune the resonant structure.

6. The system according to claim 5, wherein a strength of the variable field applied to said resonant structure determines the amount of compression or tension in the resonant structure.

7. The system according to claim 6, wherein said circuit for producing said field includes one of a current carrying coil, an evaporated coil, a wire coil, and a coil having a ferrous core.

8. The system according to claim 5, wherein said resonant structure includes one of a cantilever and a bar.

9. The system according to claim 5, further comprising:
an antenna operatively coupled to said plate.

10. The system according to claim 5, wherein said resonant structure has a plurality of sides including first and second broad sides having a major axis.

11. The system according to claim 10, wherein said resonant structure includes one of a coated magnetostrictive material and a magnetostrictive strip adhered on at least one of said first and second broad sides.

12. The system according to claim 5, wherein said circuit includes means for producing a variable magnetic field adjacent said resonant structure such that the length of the resonant structure changes with application of the magnetic field.

13. The system according to claim 5, wherein said circuit includes a bias field generator for generating a bias field, and a controller to vary an intensity of said bias field, to control an amount of magnetostriction of said resonant structure.

14. The system according to claim 13, wherein said circuit includes a coil for magnetizing the magnetostrictive material, and a direct current (DC) power supply coupled to said coil.

15. The system according to claim 5, wherein said magnetostrictive material comprises at least one material selected from iron, cobalt, nickel and permalloy, being one of plated, ion-deposited, and vapor deposited on said resonant structure.

16. The system according to claim 5, wherein said magnetostrictive material spans a length of the resonant structure.

17. The system according to claim 5, wherein a strength of the applied field selectively determines an amount of compression or tension in the resonant structure, thereby changing its resonant frequency.

18. The system according to claim 5, further comprising a support upon which at least one end of said resonant structure is positioned.

19. The system according to claim 18, wherein said resonant structure includes first and second ends supported by said support.

20. A system for tuning a resonant structure, comprising:
a magnetostrictive material provided on said resonant structure; and
a circuit for providing a variable direct current (DC) field adjacent the resonant structure, with a length of the resonant structure changing with the application of the variable field, thereby to selectively tune the resonant structure,
wherein said circuit includes a resistive element coupled to a capacitor, a mechanical resonance of the resonant structure serving to vary the capacitance of the circuit,
wherein if an incoming radio frequency (RF) field does not produce resonant mechanical excitation of the resonant structure, the resulting capacitance will be off-resonance, and
wherein if excitation resulting from the application of the variable field produces a mechanical resonance, the resonant structure resonates and a capacitance of said circuit will be modulated at its resonant frequency.

21. A system for tuning a resonant structure, comprising:
a magnetostrictive material provided on said resonant structure; and
a circuit for providing a variable direct current (DC) field adjacent the resonant structure with a length of the resonant structure changing with the application of the variable field, thereby to selectively tune the resonant structure,
wherein said magnetostrictive material extends beyond a length of the resonant structure.

22. A system for tuning a resonant structure, comprising:
a magnetostrictive material provided on said resonant structure; and
a circuit for providing a variable direct current (DC) field adjacent the resonant structure, with a length of the resonant structure changing with the application of the variable field, thereby to selectively tune the resonant structure,
wherein said circuit includes a bias field generator for generating a bias field, and a controller to vary an intensity of said bias field, to control an amount of magnetostriction of said resonant structure,
wherein said circuit includes a coil for magnetizing the magnetostriction material, a highly permeable magnetic material coupled to said coil, and a potentiometer coupled to said coil,
wherein a current of said coil is varied by the potentiometer to control the amount of magnetostriction of the resonant structure.

23. A system for tuning incoming radiation, comprising:
a resonant structure for receiving said incoming radiation;
an electrically conductive plate formed adjacent said resonant structure, said plate and said resonant structure forming a variable capacitor; and
a circuit for providing a variable dc field adjacent to the resonant structure, with a length of the resonant structure changing with the application of the variable field, thereby to selectively tune a frequency of the resonant structure.

24. The system according to claim 23, wherein said resonant structure includes one of a cantilever and a bar.

25. The system according to claim 24, wherein said one of said cantilever and said bar includes a magnetostrictive material formed on at least one side thereof.

26. The system according to claim 23, further comprising a bar support upon which at least one end of said resonant structure is supported.

27. The system according to claim 26, wherein first and second ends of said resonant structure are clamped on said bar support.

28. The system according to claim 23, further comprising:

an antenna operatively coupled to said plate.

29. A system for tuning incoming radiation, comprising:

a resonant structure for receiving said incoming radiation; and a circuit for providing a variable dc field adjacent to the resonant structure, with a length of the resonant structure changing with the application of the variable field, thereby to selectively tune a frequency of the resonant structure, wherein said resonant structure includes one of a cantilever and a bar; and a conductive plate formed adjacent said one of said cantilever and said bar.

30. A method of tuning a resonant structure, comprising:

forming, on a resonant structure, either a magnetostrictive material on one side thereof, or a doped, single crystal semiconductor material formed along a side thereof, forming an electrically conductive plate adjacent said resonant structure, said plate forming a portion of a variable capacitor; and providing one of a variable magnetic field and a variable electric field adjacent the resonant structure, with a length of the resonant structure changing with application of the variable field, thereby to selectively tune the resonant structure.

31. The method according to claim 30, further comprising:

operatively coupling an antenna to said plate.

32. A filter circuit, comprising:

a predetermined material coating provided on said resonant structure;

an electrically conductive plate formed adjacent said resonant structure, said plate forming a portion of a variable capacitor; and a circuit for providing a variable magnetic field adjacent to the resonant structure, with the length of the resonant structure changing with the application of the variable field, thereby to selectively tune the resonant structure.

\* \* \* \* \*